United States Patent
Foster, Sr. et al.

(10) Patent No.: US 7,347,251 B2
(45) Date of Patent: Mar. 25, 2008

(54) HEAT SINK FOR DISTRIBUTING A THERMAL LOAD

(75) Inventors: Jimmy G. Foster, Sr., Morrisville, NC (US); Donna C. Hardee, Releigh, NC (US); Don S. Keener, Apex, NC (US); Robert R. Wolford, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 11/314,567

(22) Filed: Dec. 21, 2005

(65) Prior Publication Data

US 2007/0137838 A1   Jun. 21, 2007

(51) Int. Cl.
F28D 15/02 (2006.01)

(52) U.S. Cl. .............. 165/104.33; 165/80.3; 361/697; 361/700

(58) Field of Classification Search ........... 165/80.2, 165/80.3, 104.21, 104.33, 185; 361/697, 361/698, 700
See application file for complete search history.

(56) References Cited

U.S. PATENT DOCUMENTS

| | | | |
|---|---|---|---|
| 4,682,651 A | 7/1987 | Gabuzda | |
| 5,265,321 A | 11/1993 | Nelson et al. | |
| 5,370,178 A | 12/1994 | Agonafer et al. | |
| 5,936,836 A | 8/1999 | Scholder | |
| 6,199,624 B1* | 3/2001 | Wotring ................ | 165/80.3 |
| 6,394,175 B1 | 5/2002 | Chen et al. | |
| 6,639,799 B2 | 10/2003 | Prasher et al. | |
| 6,704,199 B2 | 3/2004 | Wiley | |
| 6,712,128 B1 | 3/2004 | Dussinger et al. | |
| 6,717,813 B1 | 4/2004 | Garner | |
| 6,927,979 B2* | 8/2005 | Watanabe et al. ....... | 361/697 |
| 2004/0134642 A1* | 7/2004 | Lo .................. | 165/104.21 |

(Continued)

FOREIGN PATENT DOCUMENTS

JP        57042154 A     3/1982

(Continued)

OTHER PUBLICATIONS

Eldridge & Petersen; Heat-Pipe Vapor Cooling Etched Silicon Structure; IBM Technical Disclosure Bulletin; Jan. 1983; pp. 4118-4119; vol. 25 No. 8; USA.

Primary Examiner—Teresa J. Walberg
(74) Attorney, Agent, or Firm—Thomas D. Fortenberry; Cynthia S. Byrd; Biggers & Ohanian, LLP

(57) ABSTRACT

A heat sink for distributing a thermal load is disclosed that includes two or more base plates connected and oriented around a central axis of the heat sink, at least one base plate receiving the thermal load, each base plate having thermal transport paths, the thermal transport paths oriented among the base plates so as to have the capability of accepting thermal transports having a plurality of lengths for thermal distribution between at least two base plates, heat-dissipating fins connected to each base plate, the heat-dissipating fins spaced apart in parallel and extending from each base plate towards the central axis of the heat sink, and a thermal transport connected between the base plate receiving the thermal load and at least one other base plate so as to distribute the thermal load among the base plates of the heat sink.

6 Claims, 8 Drawing Sheets

U.S. PATENT DOCUMENTS

2004/0226697 A1* 11/2004 Liu .................. 165/104.33
2006/0104032 A1* 5/2006 Lee et al. ............... 361/700
2007/0114009 A1* 5/2007 Xia et al. .............. 165/104.33

FOREIGN PATENT DOCUMENTS

| | | | |
|---|---|---|---|
| JP | 8306836 A | 11/1996 |
| JP | 11118372 A | 4/1999 |
| JP | 2002318084 A | 10/2002 |
| JP | 2003115685 A | 4/2003 |
| NL | 9400082 A | 9/1995 |
| WO | WO03065775 A2 | 8/2003 |

* cited by examiner

HEAT SINK FOR DISTRIBUTING A THERMAL LOAD

BACKGROUND OF THE INVENTION

1. Field of the Invention

The field of the invention is heat sinks for distributing a thermal load.

2. Description of Related Art

The development of the EDVAC computer system of 1948 is often cited as the beginning of the computer era. Since that time, users have relied on computer systems to simplify the process of information management. Today's computer systems are much more sophisticated than early systems such as the EDVAC. Such modem computer systems deliver powerful computing resources to provide a wide range of information management capabilities through the use of computer software such as database management systems, word processors, spreadsheets, client/server applications, web services, and so on.

In order to deliver powerful computing resources, computer system designers must design powerful computer processors. Current computer processors, for example, are capable of executing billions of computer program instructions per second. Operating these computer processors requires a significant amount of power, and often such processors can consume over 100 watts. Consuming significant amounts of power generates a considerable amount of heat. Unless the heat is removed, heat generated by a computer processor may degrade or destroy the processor's functionality.

To prevent the degradation or destruction of a computer processor, a computer architect may remove heat from the processor by using heat sinks, fans, heat pipes, or even refrigeration systems. Current heat sinks, however, only provide one or two cooling surfaces with attached fins for dissipating the heat absorbed by the heat sinks. Such heat sinks are often unable to remove the heat necessary to prevent damage to today's computer processors because physical limitations may prevent a system designer from designing cooling surface large enough or fins tall enough to dissipate the required amount of heat from the processor. Combining a fan with a heat sink may improve the ability to remove heat from the computer processor, but such a combination also may not be sufficient to prevent damage to today's computer processors. Heat pipes attached to a computer processor are capable of removing large quantities of heat from the computer processor, but heat pipes may not be an option where a system designer requires a local cooling solution. Refrigeration systems also effectively remove heat, but such systems are typically large and expensive.

SUMMARY OF THE INVENTION

A heat sink for distributing a thermal load is disclosed that includes two or more base plates connected and oriented around a central axis of the heat sink, at least one base plate receiving the thermal load, each base plate having thermal transport paths, the thermal transport paths oriented among the base plates so as to have the capability of accepting thermal transports having a plurality of lengths for thermal distribution between at least two base plates, heat-dissipating fins connected to each base plate, the heat-dissipating fins spaced apart in parallel and extending from each base plate towards the central axis of the heat sink, and a thermal transport connected between the base plate receiving the thermal load and at least one other base plate so as to distribute the thermal load among the base plates of the heat sink.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
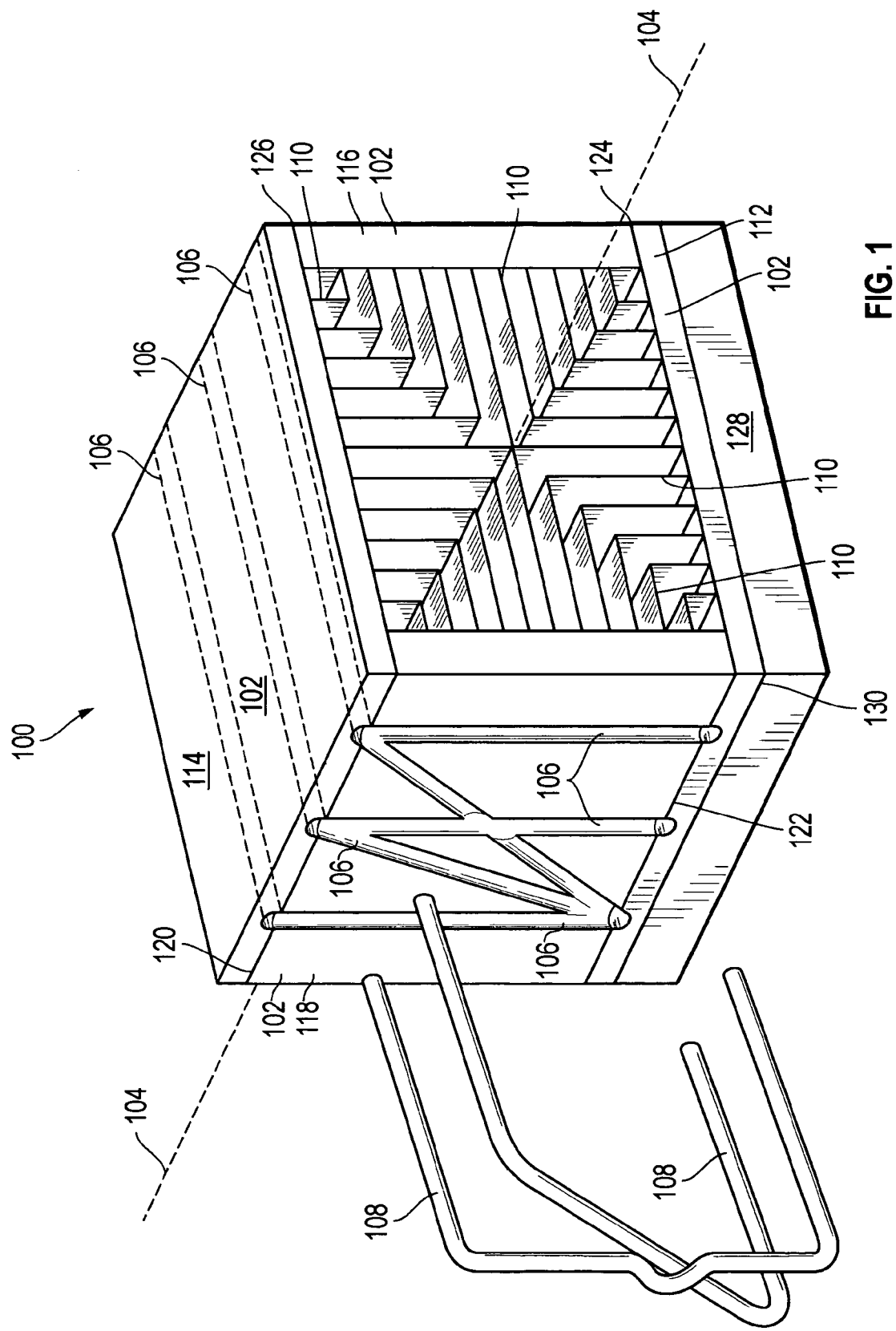
FIG. 1 sets forth a perspective view of an exemplary heat sink for distributing a thermal load according to embodiments of the present invention.

Exemplary heat sinks for distributing a thermal load according to embodiments of the present invention are described with reference to the accompanying drawings, beginning with FIG. 1. FIG. 1 sets forth a perspective view of an exemplary heat sink (100) for distributing a thermal load according to embodiments of the present invention. The thermal load is the rate of thermal energy produced over time from the operation of an integrated circuit package (128) such as, for example, a computer processor or memory chip. A measure of thermal load is typically expressed in units of Watts.

In the example of FIG. 1, the heat sink (100) is a thermal conductor configured to absorb and dissipate the thermal load from the integrated circuit package (128) thermally connected with the heat sink (100). Thermal conductors used in designing the heat sink (100) may include, for example, aluminum, copper, silver, aluminum silicon carbide, or carbon-based composites. Heat sink (100) absorbs the thermal load from the integrated circuit package through thermal conduction. When thermally connecting the heat sink (100) to the integrated circuit package (128), the heat sink provides additional thermal mass, cooler than the integrated circuit package (128), into which the thermal load may flow. After absorbing the thermal load, the heat sink (100) dissipates the thermal load through thermal convection and thermal radiation into the air surrounding the heat sink (100). Increasing the surface area of the heat sink (100) typically increases the rate of dissipating the thermal load.

Heat sink (100) in the example of FIG. 1 connects to the integrated circuit package (128) by a thermal interface (130). The thermal interface (130) is a thermally conductive material that reduces the thermal resistance associated with transferring the thermal load from the integrated circuit package (128) to the heat sink (100). The thermal interface (130) between the integrated circuit package (128) and the heat sink (100) has less thermal resistance than could typically be produced by connecting the integrated circuit package (128) directly to the heat sink (100). Decreasing the thermal resistance between the integrated circuit package (128) and the heat sink (100) increases the efficiency of transferring the thermal load from the integrated circuit package (128) to the heat sink (100). The thermal interface (130) in the example of FIG. 1 may include non-adhesive materials such as, for example, thermal greases, phase change materials, and gap-filling pads. The thermal interface (130) may also include adhesive materials such as, for example, thermosetting liquids, pressure-sensitive adhesive ('PSA') tapes, and thermoplastic or thermosetting bonding films.

The example of FIG. 1 includes two or more base plates (102) connected and oriented around a central axis (104) of the heat sink (100), at least one base plate (102) receiving the thermal load, each base plate (102) having thermal transport paths (106), the thermal transport paths (106) oriented among the base plates (102) so as to have the capability of accepting thermal transports (108) having a plurality of lengths for thermal distribution between at least two base plates (102). A thermal transport path (106) is a region adjacent to a surface of a base plate (102), the surface of the base plate (102) adapted to connect with a thermal transport. A thermal transport path (106) may include, for example, a tunnel through a base plate (102) or a channel along a surface of a base plate (102).

The example of FIG. 1 also includes a thermal transport (108) connected between the base plate (102) receiving the thermal load and at least one other base plate (102) so as to distribute the thermal load among the base plates (102) of the heat sink (100). The thermal transport (108) is a heat transfer mechanism that transports thermal energy from one region along the thermal transport to another region along the thermal transport with a minimal loss of thermal energy. Such thermal transports have an efficiency that approximates a closed thermal transfer system. Examples of thermal transports include heat pipes and carbon nanotubes. In the example of FIG. 1, the thermal transports (108) have a plurality of lengths for thermal distribution between at least two base plates (102).

The example of FIG. 1 also includes heat-dissipating fins (110) connected to each base plate (102), the heat-dissipating fins spaced apart in parallel and extending from each base plate (102) towards the central axis (104) of the heat sink (100). The heat-dissipating fins (110) are thermal conductors that provide additional surface area to heat sink (100) for dissipating the thermal load. The heat-dissipating fins (110) in the example of FIG. 1 connect to each base plate (102) by extrusion. The extruded heat-dissipating fins (110) in the example of FIG. 1 are for explanation only, and not for limitation. The heat-dissipating fins (110) may also connect to each base plate (102) by bonding the heat-dissipating fins (110) to each base plate (102) through the use of epoxy, press-fit, brazing, welding, or other connections as may occur to those of skill in the art.

In the example of FIG. 1, the two or more base plates (102) include a bottom plate (112), a top plate (114), a right plate (116), and a left plate (118), the plates connected along edges (120, 122, 124, and 126) so as to define a space generally cubical in shape with four closed sides and two open ends. In the example of FIG. 1, the right plate (116) connects with the bottom plate (112) along edges (124) using a thermal interface. Edges (124) are the upper-rightmost edge of the bottom plate (112) and the lower-rightmost edge of the right plate (116). The left plate (118) connects with the bottom plate (112) along edges (122) using a thermal interface. Edges (122) are the upper-leftmost edge of the bottom plate (112) and the lower-leftmost edge of the left plate (118). The right plate (116) connects with the top plate (114) along edges (126) using a thermal interface. Edges (126) are the lower-rightmost edge of the upper plate (114) and the upper-rightmost edge of the right plate (116). The left plate (118) connects with the top plate (114) along edges (120) using a thermal interface. Edges (120) are the lower-leftmost edge of the upper plate (114) and the upper-leftmost edge of the left plate (118). In the example of FIG. 1, the bottom plate (112) connects to the integrated circuit package (128) to receive a thermal load for distribution among the base plates (102) of the heat sink (100).

Figure 2:
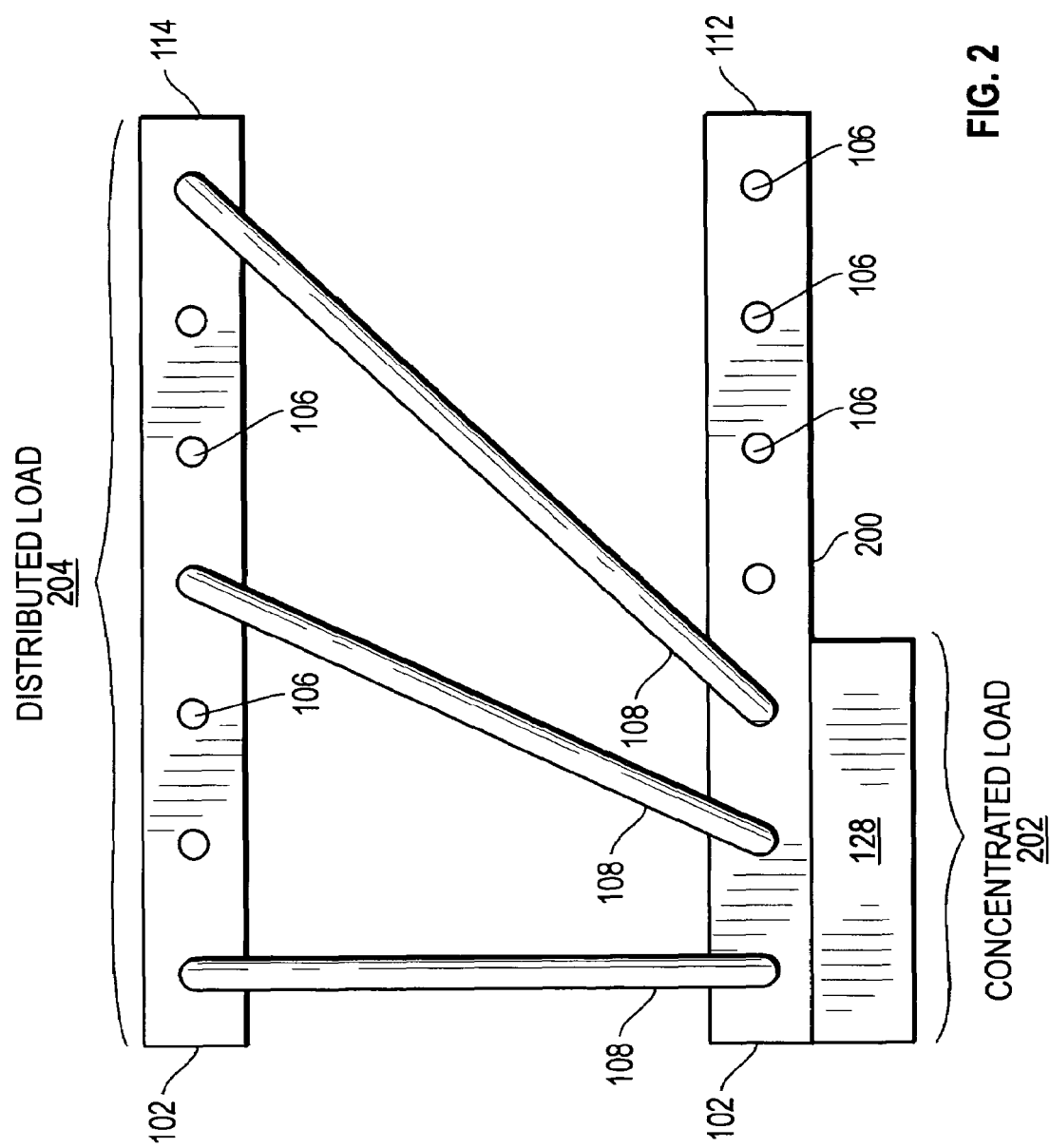
FIG. 2 sets forth a right side view of exemplary base plates and exemplary thermal transports useful in a heat sink for distributing a thermal load according to embodiments of the present invention.

For further explanation, FIG. 2 sets forth a right side view of exemplary base plates (102) and exemplary thermal transports (108) useful in a heat sink for distributing a thermal load according to embodiments of the present invention. In the example of FIG. 2, each base plate (102) includes thermal transport paths (106), the thermal transport paths (106) oriented among the base plates (102) so as to have the capability of accepting thermal transports (108) having a plurality of lengths for thermal distribution between at least two base plates (102). The base plates (102) in the example of FIG. 2 are implemented as a bottom plate (112) and a top plate (114).

In the example of FIG. 2, the bottom plate (112) connects to an integrated circuit package (128) to receive a thermal load for distribution among the base plates (102) of a heat sink. The bottom plate (112) connects to the integrated circuit package (128) along the left-most portion of the lower surface (200) of the bottom plate (112). The bottom plate (112) may connect to the integrated circuit package (128) at the left-most portion of the lower surface (200) of the bottom plate (112) because physical limitations of a heat sink environment prohibit centering the integrated circuit package (128) along the lower surface (200) of the bottom plate (112). Connecting the bottom plate (112) to the integrated circuit package (128) along the left-most portion of the lower surface (200) of the bottom plate (112) results in uneven distribution of the thermal load across the bottom plate (112). In the example of FIG. 2, the concentrated load (202) represents that the thermal load is concentrated in the left-most portion of the bottom plate (112). In other embodiments where the bottom plate (112) connects to the integrated circuit package (128) along the entire lower surface (200), uneven distribution of the thermal load across the bottom plate (112) may occur when one region of the integrated circuit package (128) produces a greater thermal load than another region of the integrated circuit package (128).

The example of FIG. 2 includes thermal transports (108) connected between the bottom plate (112) receiving the thermal load and the top plate (114) so as to distribute the thermal load among the base plates (102) of a heat sink. The thermal transports (108) engage the thermal transport paths (106) oriented among the base plates (102) so as to have the capability of accepting thermal transports (108) having a plurality of lengths for thermal distribution between at least two base plates (102). Each thermal transport (108) in the example of FIG. 2 is a different length so as to distribute the concentrated load (202) from the left-most portion of the bottom plate (112) across the entire top plate (114). In the example of FIG. 2, the distributed load (204) represents the thermal load from the integrated circuit package (128) distributed across the top plate (114). The top plate (114) and the heat-dissipating fins (not shown) connected to the top plate (114) dissipate the distributed load (204) into the environment surrounding a heat sink.

Figure 3:
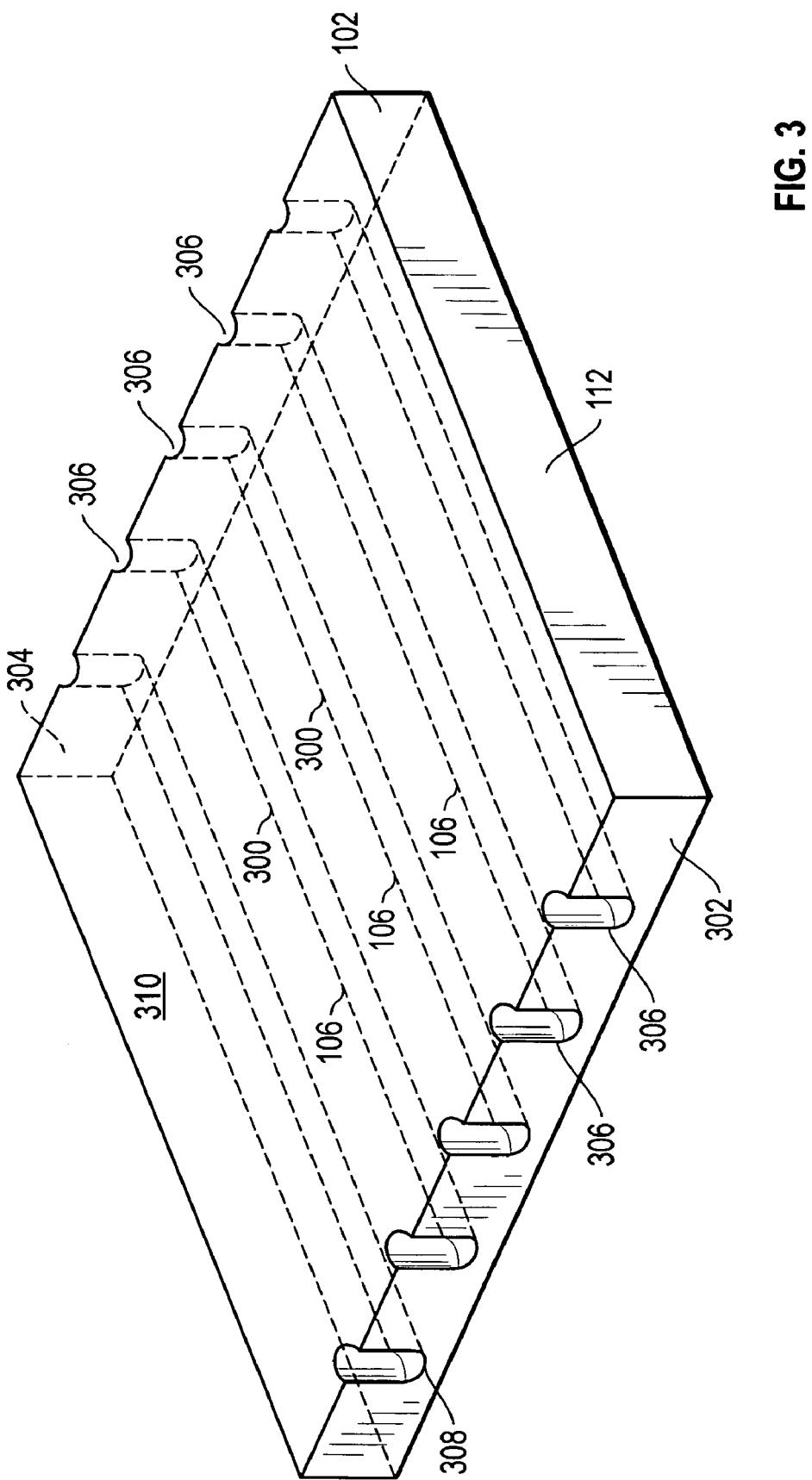
FIG. 3 sets forth a perspective view of a further exemplary base plate useful in a heat sink for distributing a thermal load according to embodiments of the present invention.

For further explanation, FIG. 3 sets forth a perspective view of an exemplary base plate (102) useful in a heat sink for distributing a thermal load according to embodiments of the present invention; In the example of FIG. 3, the heat-dissipating fins are omitted for explanation and clarity. The base plate (102) in the example of FIG. 3 is implemented as a bottom plate (112). The thermal transport paths (106) of the bottom plate (112) include lower heat pipe tunnels (300) spaced apart in parallel. The lower heat pipe tunnels (300) in the example of FIG. 3 have the capability of accepting heat pipes having a plurality of lengths for thermal distribution between at least two base plates (102).

In the example of FIG. 3, lower heat pipe tunnels (300) are circular tunnels that extend through the bottom plate (112) from the left surface (302) of the bottom plate (112) to the right surface (304) of the bottom plate (112). The diameters of the lower heat pipe tunnels (300) conform to the diameters of the heat pipes having a plurality of lengths accepted by the lower heat pipe tunnels (300). In the example of FIG. 3, the lower heat pipe tunnels (300) are spaced equally apart in parallel.

The example of FIG. 3 also includes semicircular cavities (306) along the left surface (302) of the bottom plate (112) and along the right surface (304) of the bottom plate (112). The diameters of the semicircular cavity (306) conform to the diameters of the lower heat pipe tunnels (300). Each semicircular cavity (306) intersects one of the lower heat pipe tunnels (300). In the example of FIG. 3, each semicircular cavity (306) extends from the bottom (308) of a lower heat pipe tunnel (300) to the upper surface (310) of the bottom plate (112).

Figure 4:
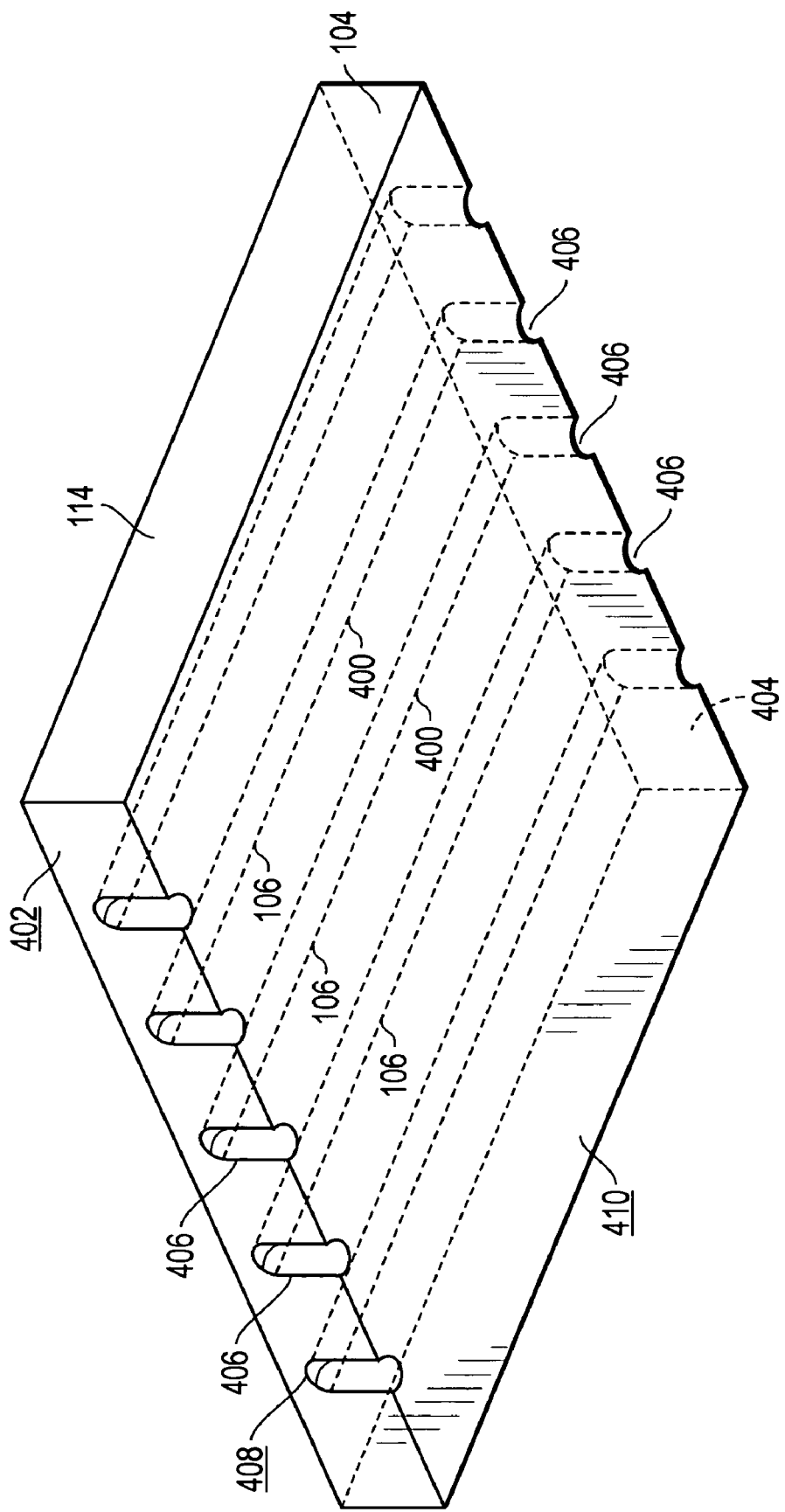
FIG. 4 sets forth a perspective view of a further exemplary base plate useful in a heat sink for distributing a thermal load according to embodiments of the present invention.

For further explanation, FIG. 4 sets forth a perspective view of an exemplary base plate (102) useful in a heat sink for distributing a thermal load according to embodiments of the present invention. In the example of FIG. 4, the heat-dissipating fins are omitted for explanation and clarity. The base plate (102) in the example of FIG. 4 is implemented as a top plate (114). The thermal transport paths (106) of the top plate (114) include upper heat pipe tunnels (400) spaced apart in parallel. The upper heat pipe tunnels (400) in the example of FIG. 4 have the capability of accepting heat pipes having a plurality of lengths for thermal distribution between at least two base plates (102).

In the example of FIG. 4, upper heat pipe tunnels (400) are circular tunnels that extend through the top plate (114) from the left surface (402) of the top plate (114) to the right surface (404) of the top plate (114). The diameters of the upper heat pipe tunnels (400) conform to the diameters of the heat pipes having a plurality of lengths accepted by the upper heat pipe tunnels (400). In the example of FIG. 4, the upper heat pipe tunnels (400) are spaced equally apart in parallel.

The example of FIG. 4 also includes semicircular cavities (406) along the left surface (402) of the top plate (114) and along the right surface (404) of the top plate (114). The diameters of the semicircular cavity (406) conform to the diameters of the upper heat pipe tunnels (400). Each semicircular cavity (406) intersects one of the upper heat pipe tunnels (400). In the example of FIG. 4, each semicircular cavity (406) extends from the top (408) of a upper heat pipe tunnel (400) to the lower surface (410) of the top plate (114).

Figure 5:
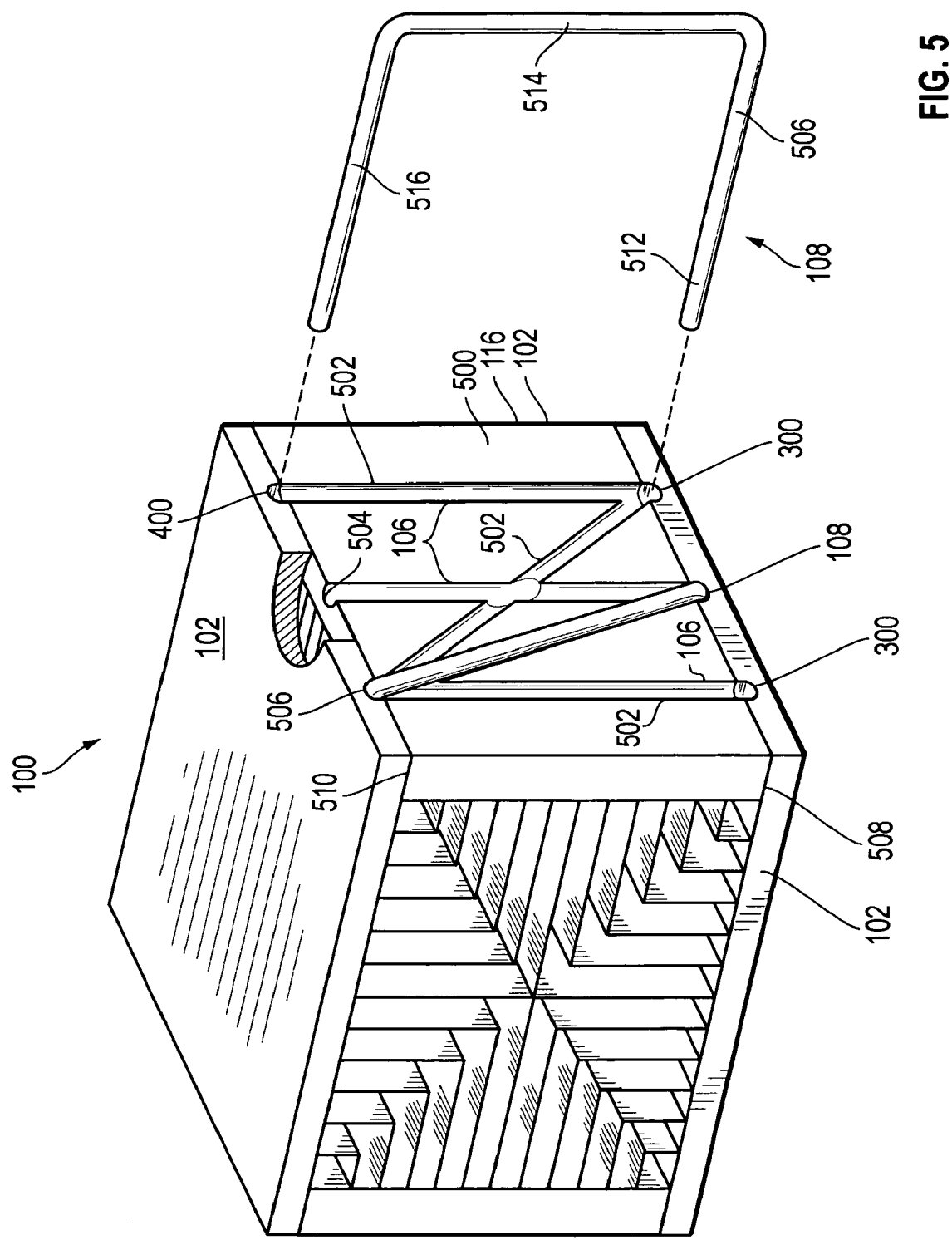
FIG. 5 sets forth a perspective view of a further exemplary heat sink for distributing a thermal load according to embodiments of the present invention.

For further explanation, FIG. 5 sets forth a perspective view of a further exemplary heat sink (100) for distributing a thermal load according to embodiments of the present invention. The exemplary heat sink (100) of FIG. 5 includes a base plate (102) and thermal transport (108). The base plate (102) in the example of FIG. 5 is implemented as a right plate (116). The right plate (116) includes a right outer surface (500). The thermal transport paths (106) of the right plate (116) include right heat pipe channels (502) along the right outer surface (500), each right heat pipe channel (502) including a semicircular cavity (504) longitudinally extending from one of the lower heat pipe tunnels (300) to one of the upper heat pipe tunnels (400). Each thermal transport (108) in the example of FIG. 5 includes a heat pipe (506) connected between one of the lower heat pipe tunnels (300), one of the right heat pipe channels (502), and one of the upper heat pipe tunnels (400) so as to distribute the thermal load among the base plates (102) of the heat sink (100).

In the example of FIG. 5, the right heat pipe channels (502) are semicircular cavities (504) along the right outer surface (500) that extend in length from the bottom surface (508) of the right plate (116) to the top surface (510) of the right plate (116). Each right heat pipe channel (502) intersects the bottom surface (508) of the right plate (116) at a location adjacent to one of the lower heat pipe tunnels (300). Each right heat pipe channel (502) intersects the top surface (510) of the right plate (116) at a location adjacent to one of the upper heat pipe tunnels (400). The diameters of the right heat pipe channels (502) in the example of FIG. 5 conforms to the diameters of the lower heat pipe tunnels (300) and the upper heat pipe tunnels (400).

In the example of FIG. 5, each heat pipe (506) is a closed evaporator-condenser system consisting of a sealed, hollow tube whose inside walls are lined with a capillary structure, also referred to as a 'wick.' A thermodynamic working fluid having substantial vapor pressure at the desired operating temperature saturates the pores of the wick. The fluid heats and evaporates when heat is applied to a region of the heat pipe (506). As the evaporating fluid fills the hollow center of the wick, the vapor diffuses throughout the heat pipe (506). The vapor condenses in the heat pipe (506) wherever the temperature along the heat pipe (506) falls below the temperature of the evaporation area. As the vapor condenses, the vapor releases the heat the vapor acquired during evaporation. Capillary action within the wick returns the condensate to the evaporation area and completes the operating cycle.

In the example of FIG. 5, each heat pipe (506) is connected between one of the lower heat pipe tunnels (300), one of the right heat pipe channels (502), and one of the upper heat pipe tunnels (400) so as to distribute the thermal load among the base plates (102) of the heat sink (100). Each heat pipe (506) in the example of FIG. 5 includes a bottom section (512) that inserts into the lower heat pipe tunnel (300). The heat pipe (506) also includes a lateral section (514) adjacent to the bottom section (512). The lateral section (514) of the heat pipe (506) connects with the inner surface of the right heat pipe channel (502). The heat pipe (506) further includes a top section (516) adjacent to the lateral section (514). The top section (516) of the heat pipe (506) inserts into the upper heat pipe tunnel (400).

In the example of FIG. 5, each heat pipe (506) is connected between one of the lower heat pipe tunnels (300), one of the right heat pipe channels (502), and one of the upper heat pipe tunnels (400) by a press-fit connection. Such a press-fit connection is for example only, and not for limitation. The heat pipe (506) may also connect between one of the lower heat pipe tunnels (300), one of the right heat pipe channels (502), and one of the upper heat pipe tunnels (400) by fastening mechanism such as, for example, a clip, a screw, or an adhesive.

Figure 6:
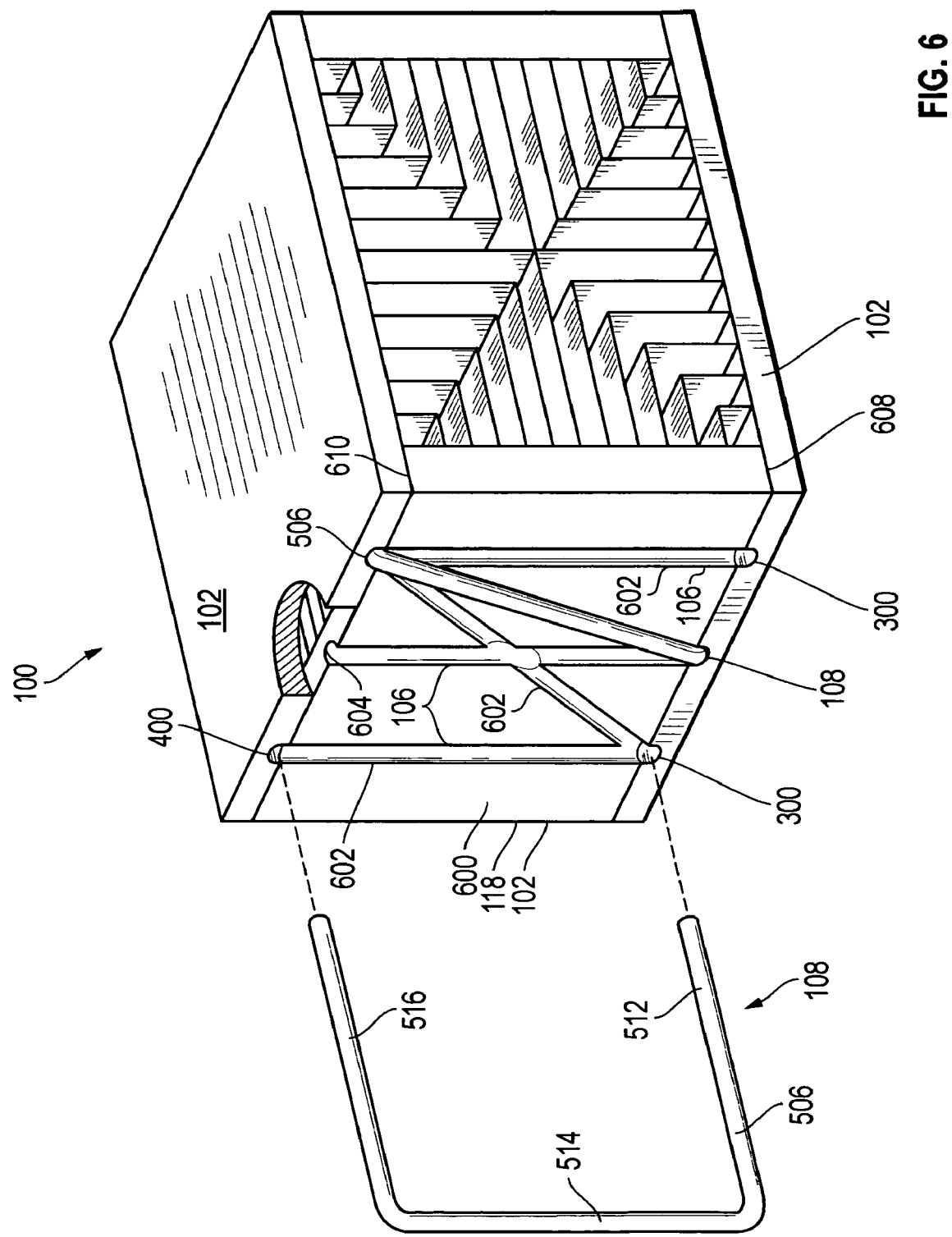
FIG. 6 sets forth a perspective view of a further exemplary heat sink for distributing a thermal load according to embodiments of the present invention.

For further explanation, FIG. 6 sets forth a perspective view of a further exemplary heat sink (100) for distributing a thermal load according to embodiments of the present invention. The exemplary heat sink (100) of FIG. 6 includes a base plate (102) and thermal transport (108). The base plate (102) in the example of FIG. 6 is implemented as a left plate (118). The left plate (118) includes a left outer surface (600). The thermal transport paths (106) of the left plate (118) include left heat pipe channels (602) along the left outer surface (600), each left heat pipe channel (602) including a semicircular cavity (604) longitudinally extending from one of the lower heat pipe tunnels (300) to one of the upper heat pipe tunnels (400). Each thermal transport (108) in the example of FIG. 6 includes a heat pipe (506) connected between one of the lower heat pipe tunnels (300), one of the left heat pipe channels (602), and one of the upper heat pipe tunnels (400) so as to distribute the thermal load among the base plates (102) of the heat sink (100).

In the example of FIG. 6, the left heat pipe channels (602) are semicircular cavities (604) along the left outer surface (600) that extend in length from the bottom surface (608) of the left plate (118) to the top surface (610) of the left plate (118). Each left heat pipe channel (602) intersects the bottom surface (608) of the left plate (118) at a location adjacent to one of the lower heat pipe tunnels (300). Each left heat pipe channel (602) intersects the top surface (610) of the left plate (118) at a location adjacent to one of the upper heat pipe tunnels (400). The diameters of the left heat pipe channels (602) in the example of FIG. 6 conforms to the diameters of the lower heat pipe tunnels (300) and the upper heat pipe tunnels (400).

In the example of FIG. 6, each heat pipe (506) is connected between one of the lower heat pipe tunnels (300), one of the left heat pipe channels (602), and one of the upper heat pipe tunnels (400) so as to distribute the thermal load among the base plates (102) of the heat sink (100). Each heat pipe (506) in the example of FIG. 6 includes a bottom section (512) that inserts into the lower heat pipe tunnel (300). The heat pipe (506) also includes a lateral section (514) adjacent to the bottom section (512). The lateral section (514) of the heat pipe (506) connects with the inner surface of the left heat pipe channel (602). The heat pipe (506) further includes a top section (516) adjacent to the lateral section (514). The top section (516) of the heat pipe (506) inserts into the upper heat pipe tunnel (400).

In the example of FIG. 6, each heat pipe (506) is connected between one of the lower heat pipe tunnels (300), one of the left heat pipe channels (602), and one of the upper heat pipe tunnels (400) by a press-fit connection. Such a press-fit connection is for example only, and not for limitation. The heat pipe (506) may also connect between one of the lower heat pipe tunnels (300), one of the left heat pipe channels (602), and one of the upper heat pipe tunnels (400) by fastening mechanism such as, for example, a clip, a screw, or an adhesive.

Figure 7:
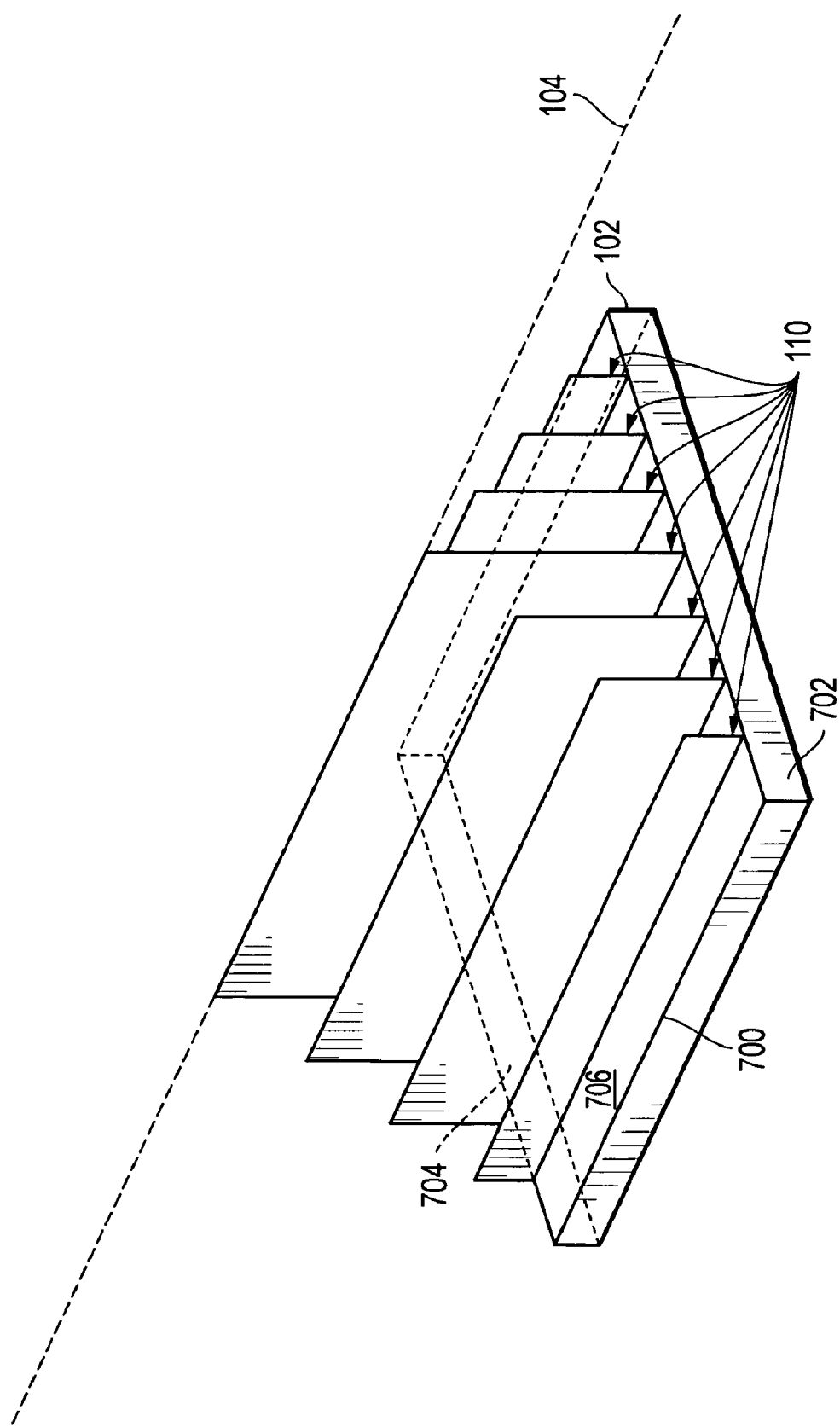
FIG. 7 sets forth a perspective view of a further exemplary base plate and exemplary heat-dissipating fins useful in a heat sink for distributing a thermal load according to embodiments of the present invention.

For further explanation of heat-dissipating fins, FIG. 7 sets forth a perspective view of a further exemplary base plate (102) and exemplary heat-dissipating fins (110) useful in a heat sink for distributing a thermal load according to embodiments of the present invention. The depiction of the heat-dissipating fins (110) and one of the base plates (102) in the example of FIG. 7 represents a bottom portion of a heat sink for distributing a thermal load. The remaining portions of the heat sink are omitted from this example for clarity of explanation.

In the example of FIG. 7, the heat-dissipating fins (110) connect to the base plate (102) by extrusion from the base plate (102). As mentioned above, extruded heat-dissipating fins are for explanation, and not for limitation. The heat-dissipating fins (110) may also connect to the base plate (102) by bonding the fins (110) to the base plate (102) through the use of epoxy, brazing, or welding.

The heat-dissipating fins (110) in the example of FIG. 7 are spaced apart in parallel and extend from the base plate (102) towards the central axis (104) of the heat sink. Each heat-dissipating fin (110) extends in height from an upper surface (706) of the base plate (102) to the plane formed by the upper-leftmost edge (700) of the base plate (102) and the central axis (114). The heat-dissipating fins (110) extend in length from a bottom front surface (702) to a bottom back surface (704).

In the example of FIG. 7, manufacturing capabilities may restrict the thickness of the heat-dissipating fins (110) and number of heat-dissipating fins (110) connected to base plate (102). While thinner fins may allow a heat sink designer to place more fins in a given space because the gaps between fins are smaller, thinner fins may also limit the height of the fins. Extruded heat-dissipating fins (110) in the example of FIG. 7 typically have fin height-to-gap aspect ratios of up to 6 and a minimum fin thickness of 1.3 millimeters. Special die design features may however increase the height-to-gap aspect ratio to 10 and decrease the minimum fin thickness to 0.8 millimeters. For example, given a maximum heat-dissipating fin (110) height of 30 millimeters and a fin height-to-gap aspect ratio of 6, the minimum gap between heat-dissipating fins (110) is calculated as follows:

$$G=H\div R=30\div 6=5 \text{ millimeters}$$

where G is the gap between the heat-dissipating fins, H is the height of the heat-dissipating fins, and R is the fin height-to-gap aspect ratio.

After obtaining the minimum gap between fins (110), the number of heat-dissipating fins (110) is calculated as the quantity of the width of the plate plus the gap between fins divided by the quantity of the fin thickness plus the gap. Continuing with the previous example, given a base plate (102) width of 60 millimeters and a fin thickness of 1.3 millimeters, the number of heat-dissipating fins (110) connected the base plate (102) is calculated as follows:

$$N=(W+G)\div(T+G)=(60+5)\div(5+1.3)=10.3 \text{ fins}$$

where N is the number of heat-dissipating fins that a plate may accommodate, W is the width of the plate, G is the gap between the heat-dissipating fins, and T is the thickness of the heat-dissipating fins. This calculation for the number of fins yields 10.3 fins, meaning that in this example, the plate may accommodate 10 fins.

Figure 8:
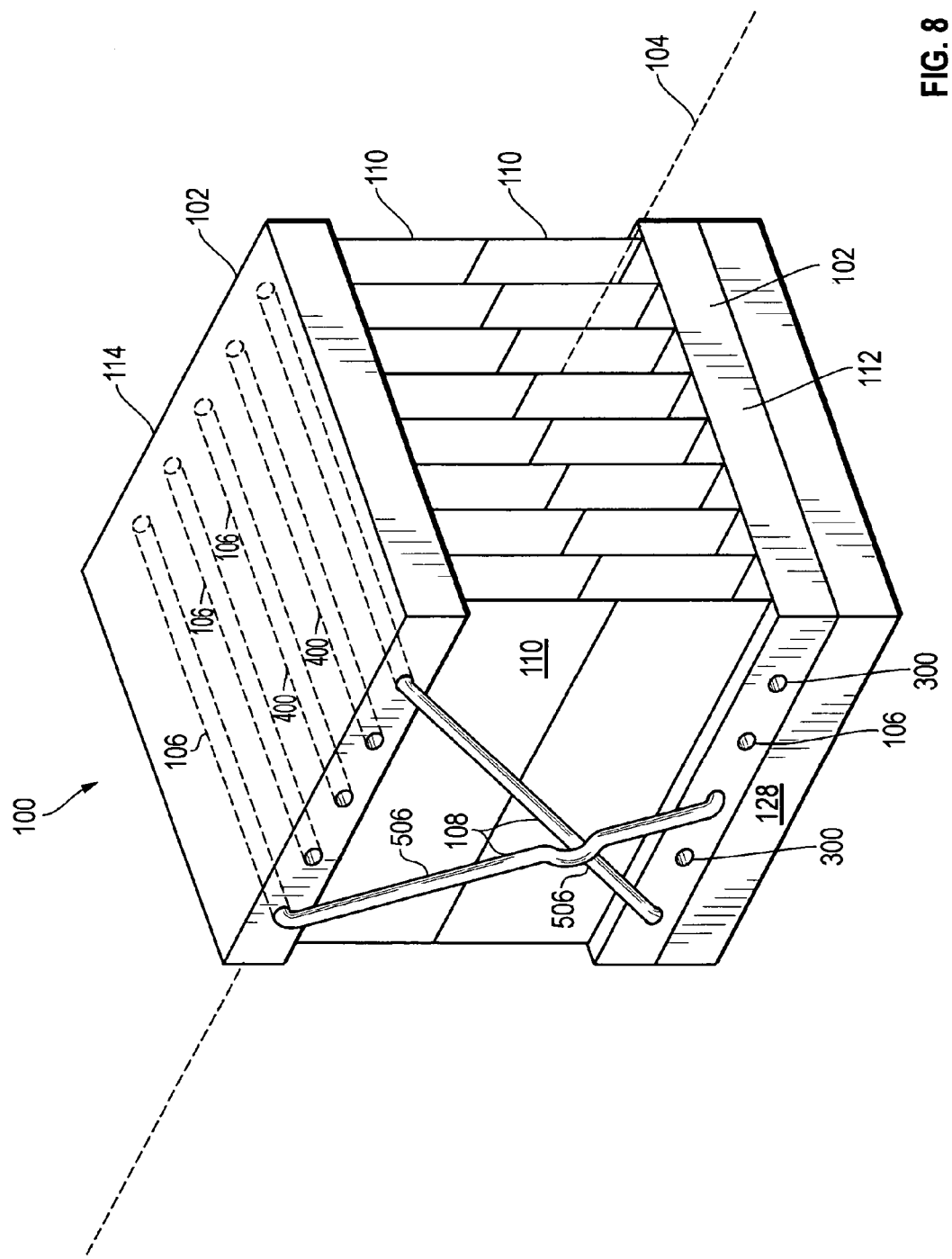
FIG. 8 sets forth a perspective view of a further exemplary heat sink for distributing a thermal load according to embodiments of the present invention.

For further explanation, FIG. 8 sets forth a perspective view of a further exemplary heat sink (100) for distributing a thermal load according to embodiments of the present invention. The example of FIG. 8 includes two or more base plates (102) connected and oriented around a central axis (104) of the heat sink (100), at least one base plate (102)

receiving the thermal load, each base plate (102) having thermal transport paths (106), the thermal transport paths (106) oriented among the base plates (102) so as to have the capability of accepting thermal transports (108) having a plurality of lengths for thermal distribution between at least two base plates (102). In the example of FIG. 8, the two or more base plates (102) include only a bottom plate (112) and a top plate (114). The bottom plate (112) connects to an integrated circuit package (128) to receive a thermal load for distribution among the base plates (102) of the heat sink (100). The thermal transport paths (106) of the bottom plate (112) include lower heat pipe tunnels (300) spaced apart in parallel, and the thermal transport paths (106) of the top plate (114) include upper heat pipe tunnels (400) spaced apart in parallel.

The example of FIG. 8 also includes heat-dissipating fins (110) connected to each base plate (102), the heat-dissipating fins spaced apart in parallel and extending from each base plate (102) towards the central axis (104) of the heat sink (100). In the example of FIG. 8, the heat-dissipating fins (110) connect to each base plate (102) by extrusion from the base plate (102). As mentioned above, extruded heat-dissipating fins are for explanation, and not for limitation. The heat-dissipating fins (110) may also connect to the base plate (102) by bonding the fins (110) to the base plate (102) through the use of epoxy, brazing, or welding. In the example of FIG. 8, the top plate (114) and the bottom plate (112) are connected through heat-dissipating fins (110), the heat-dissipating fins (110) connected to the bottom plate (112) connecting to the heat-dissipating fins (110) connected to the top plate (114).

The example of FIG. 8 also includes thermal transports (108) connected between the base plate (102) receiving the thermal load and at least one other base plate (102) so as to distribute the thermal load among the base plates (102) of the heat sink (100). In the example of FIG. 8, the thermal transport (108) include heat pipes (506) connected between one of the lower heat pipe tunnels (300) and one of the upper heat pipe tunnels (400) so as to distribute the thermal load among the base plates (102) of the heat sink (100).

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A heat sink for distributing a thermal load, the heat sink comprising:
   two or more base plates connected and oriented around a central axis of the heat sink, at least one of the base plates receiving the thermal load, each base plate having thermal transport paths, the thermal transport paths oriented among the base plates so as to have the capability of accepting thermal transports having a plurality of lengths for thermal distribution between at least two of the base plates;
   heat-dissipating fins connected to each base plate, the heat-dissipating fins spaced apart in parallel and extending from each base plate towards the central axis of the heat sink; and
   thermal transports having a plurality of lengths and connected between the base plate receiving the thermal load and at least one other base plate so as to distribute the thermal load among the base plates of the heat sink.

2. The heat sink of claim 1 wherein:
   the two or more base plates further comprise a bottom plate, a top plate, a right plate, and a left plate, the plates connected along edges so as to define a space generally cubical in shape with four closed sides and two open ends;
   thermal transport paths of the bottom plate comprising lower heat pipe tunnels spaced apart in parallel;
   thermal transport paths of the top plate comprising upper heat pipe tunnels spaced apart in parallel;
   the right plate further comprises a right outer surface;
   thermal transport paths of the right plate comprising right heat pipe channels along the right outer surface, each right heat pipe channel comprising a semicircular cavity longitudinally extending from one of the lower heat pipe tunnels to one of the upper heat pipe tunnels;
   the left plate further comprises a left outer surface; and
   thermal transport paths of the left plate comprising left heat pipe channels along the left outer surface, each left heat pipe channel comprising a semicircular cavity longitudinally extending from one of the lower heat pipe tunnels to one of the upper heat pipe tunnels.

3. The heat sink of claim 2 wherein each thermal transport further comprises a heat pipe connected between one of the lower heat pipe tunnels, one of the right heat pipe channels, and one of the upper heat pipe tunnels so as to distribute the thermal load among the base plates of the heat sink.

4. The heat sink of claim 2 wherein each thermal transport further comprises a heat pipe connected between one of the lower heat pipe tunnels, one of the left heat pipe channels, and one of the upper heat pipe tunnels so as to distribute the thermal load among the base plates of the heat sink.

5. The heat sink of claim 1 wherein:
   the two or more base plates include only a bottom plate and a top plate, the thermal transport paths of the bottom plate comprising lower heat pipe tunnels spaced apart in parallel, the thermal transport paths of the top plate comprising upper heat pipe tunnels spaced apart in parallel; and
   the top plate and the bottom plate are connected through heat-dissipating fins, the heat-dissipating fins connected to the bottom plate connecting to the heat-dissipating fins connected to the top plate.

6. The heat sink of claim 5 wherein each thermal transport further comprises a heat pipe connected between one of the lower heat pipe tunnels and one of the upper heat pipe tunnels so as to distribute the thermal load among the base plates of the heat sink.

* * * * *